United States Patent [19]
Poutanen et al.

[11] Patent Number: 5,978,795
[45] Date of Patent: Nov. 2, 1999

[54] TEMPORALLY ORDERED BINARY SEARCH METHOD AND SYSTEM

[75] Inventors: Tomi J. Poutanen; Jonathan Forbes, both of Toronto, Canada

[73] Assignee: Microsoft Corporation, Redmond, Wash.

[21] Appl. No.: 08/783,491

[22] Filed: Jan. 14, 1997

[51] Int. Cl.[6] .................................. G06F 17/30
[52] U.S. Cl. ...................... 707/3; 707/4; 707/6
[58] Field of Search .................. 707/100, 1, 3, 707/7, 6, 101, 201; 395/182.06, 200.57, 200.5, 708; 695/11; 364/300

[56] References Cited

U.S. PATENT DOCUMENTS

| | | | |
|---|---|---|---|
| 4,677,550 | 6/1987 | Ferguson | 364/300 |
| 5,051,745 | 9/1991 | Katz | 341/51 |
| 5,086,504 | 2/1992 | Nemeth-Johannes et al. | 395/708 |
| 5,140,321 | 8/1992 | Jung | 341/55 |
| 5,146,571 | 9/1992 | Longan | 395/182.06 |
| 5,202,986 | 4/1993 | Nickel | 707/3 |
| 5,281,967 | 1/1994 | Jung | 341/55 |
| 5,446,887 | 8/1995 | Berkowitz | 707/101 |
| 5,454,102 | 9/1995 | Tang et al. | 707/1 |
| 5,497,485 | 3/1996 | Ferguson et al. | 707/1 |
| 5,557,786 | 9/1996 | Johnson, Jr. | 707/101 |
| 5,619,615 | 4/1997 | Pitchaikani et al. | 695/11 |
| 5,619,693 | 4/1997 | Troisi | 707/7 |
| 5,651,009 | 7/1997 | Perreault et al. | 370/447 |
| 5,664,179 | 9/1997 | Tucker | 707/100 |
| 5,724,517 | 3/1998 | Cook et al. | 395/200.57 |
| 5,758,353 | 5/1998 | Marquis | 707/201 |
| 5,784,557 | 7/1998 | Oprescu | 395/200.5 |
| 5,787,430 | 7/1998 | Doeringer et al. | 707/100 |
| 5,870,735 | 2/1999 | Agrawal et al. | 707/3 |

OTHER PUBLICATIONS

Knuth, "The Art of Computer Programming" second edition, Addison–Wesley Publishing Company, Inc, 1973, pp. 347–351.

Robert Kruse, "Data Structures & Program Design", Prentice–Hall, Inc., Englewood cliffs, New Jersey 07632, pp. 93–100, 1984.

Lin Chen and Rene Schott, "Optimal Operations on Red–Black Trees", IEEE, pp. 529–533, 1993.

*Primary Examiner*—Wayne Amsbury
*Assistant Examiner*—Thuy Pardo
*Attorney, Agent, or Firm*—Law Offices of Albert S. Michalik

[57] ABSTRACT

A method and system for maintaining a binary tree of pointers to a stream of data and for searching same. A novel binary tree is created by a search engine in which the nodes associated with strings in the data stream which are closer to the current data stream position are nearer the root of the tree than nodes associated with strings which are farther. As the current position in the stream is advanced, the search engine inserts a new node to the tree for that position as the root node. The tree is then restructured based on the relative value of the strings of each node while preserving the temporal order of the tree such that strings nearer the current position are associated with nodes which are closer to the root. The tree is ideal for searching data for LZ77-based data compression, since a single traversal of the tree returns the longest match length with the smallest offset.

39 Claims, 13 Drawing Sheets

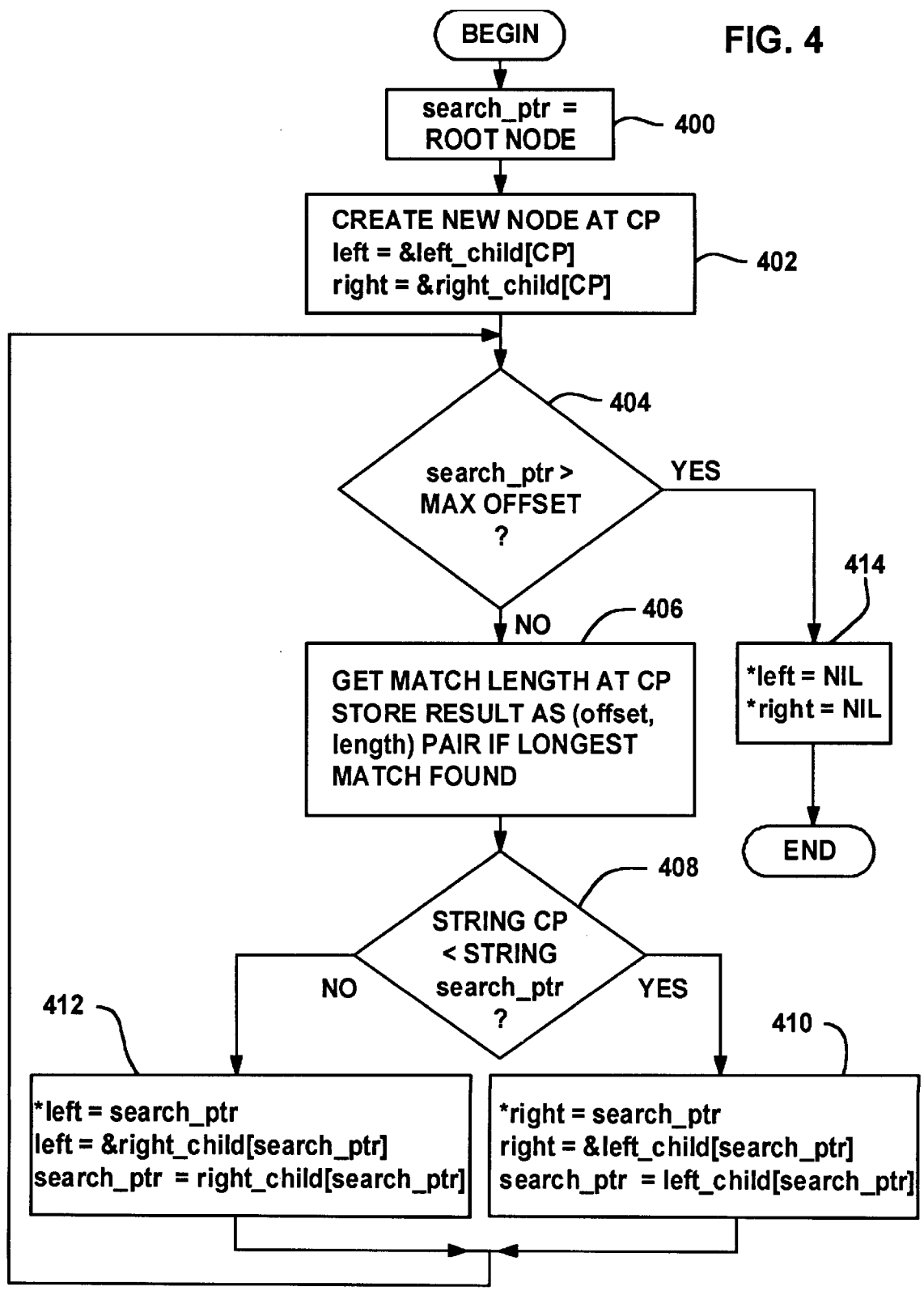

TEMPORALLY ORDERED BINARY SEARCH METHOD AND SYSTEM

FIELD OF THE INVENTION

The invention relates generally to computer data searches, and more particularly to an improved binary search method and system.

BACKGROUND OF THE INVENTION

Computer search algorithms are used by many programs including data compression engines and database search engines. For example, an LZ77-based data compression algorithm transforms a stream of data into Huffman codes representing either a byte in the stream or a number of bytes which have previously appeared in the data stream and which are within a sliding history window of finite size. LZ77compression engines thus require a search engine to search previous locations in the data stream in order to find the largest and closest possible match, if any, with the current data string that is to be compressed.

One commonly-used search algorithm is the hash-chain search algorithm which linearly searches through a chain of buffer locations with the same hash value. In general, the hash chain search algorithm breaks a complete linear search into a number of smaller linear searches. The hash chain search algorithm provides acceptable results with short search windows, e.g., wherein the hash value is twelve to fifteen bits in length and the search window is limited in size to thirty-two to sixty-four kilobytes. However, with larger window sizes and/or hash values, the time required to hash chain search becomes significant, and becomes a substantial bottleneck in the compression process.

Binary search algorithms search for a data pattern by traversing a tree of nodes using one pointer to a subtree of all nodes smaller than the current node and another pointer to a subtree of nodes which are larger. Although binary searches can approach log(n) search times and are thus faster than linear searches in most cases dealing with large search windows, they are difficult to realize in many types of data compression encoders, including an LZ77 encoder. More particularly, inserting new nodes into a binary tree and/or deleting old nodes which exceed the window size requires a complete search of the tree and thus make the search costly. The overall cost is significant because once the encoder's input stream reaches the window size, every time the stream pointer is advanced, (and a node inserted into the binary search tree), a node must be deleted from the tree.

Moreover, in an LZ77-based encoder, finding the closest offset is statistically important for providing improved compression. Thus, an LZ77-based encoder seeks to locate the closest match of a certain length, but the ordering of the nodes in a binary search tree makes it difficult to do so. By way of example, consider the conventional binary search tree structure of FIG. 1, wherein the offset from the current string pointer is represented by the value in parentheses. Note that in the conventional binary search tree of FIG. 1, new nodes are inserted as leaves of the tree, and thus the most-recently inserted nodes, which represent strings having the smallest offsets, are located at the tree leaves. If a search commences beginning with the character string "CAD . . . ," the search progresses from the root "CAN . . . " to the left subtree of root "BAT . . . " and on to "CAB . . . " before the search is terminated by the leaf node. Match lengths of two ("CA") are thus found at offsets eighty (80) and sixty (60). However, there are two other strings in the tree which have a match length of two, namely, "CAT . . . " and "CAR . . . " at offsets seventy (70) and twenty (20), respectively. Thus, although a normal binary search finds the largest match length, the binary search does not necessarily find the largest match length with the lowest offset. Accordingly, such a search must be modified (e.g., nodes of the same match length are flagged and all possible subtrees paths with the same lengths searched until the closest offset is found) in order to be used with a proper LZ77-based encoder. As can be appreciated, such a modified search is complex and is often relatively slow, failing to approach log(n) performance.

In short, hash chain algorithms provide poor performance when searching large compression windows. At the same time, existing binary search algorithms have a number of drawbacks associated therewith that make using binary search trees for data compression purposes rather cumbersome.

OBJECTS AND SUMMARY OF THE INVENTION

Accordingly, it is a general object of the present invention to provide an improved binary search method and system.

A related object is to provide an improved binary search tree.

Another object is to provide a method and system of the above kind that facilitate LZ77-based data compression.

A related object is to provide a method and system wherein a single search of a binary tree returns at least the largest match length with the closest offset.

Another object is to provide a method and system which return a plurality of distinct match lengths and corresponding offsets.

In accomplishing those objects, another object is to provide a method and system as characterized above that function efficiently and rapidly with search windows having relatively large sizes.

Yet another object is to provide a method and system of the above kind that is flexible, extensible and provides for enhancements and optimizations.

Briefly, the present invention provides a method for restructuring an existing tree of nodes wherein each node is associated with a position in a stream of data and has a first and second directional pointer associated therewith, and each position in the stream of data has a relative value associated therewith. As the data is processed, a current position in the stream is selected that is logically beyond a previous position corresponding to the root node of the existing tree. A new root node associated with the current position in the data stream is created. The string at the current position is then compared with the string at the previous position, and, if larger, the left pointer of the new root node points to the node of the previous position, and the left pointer of the node of the previous position is maintained so as to point to any smaller children thereof. The right pointer of the node associated with the previous position is examined to determine if it has a child node. Conversely, if the string at the current position is smaller than the string at the previous position, the right pointer of the new root node points to the node of the previous position, and the right pointer of the node of the previous position is maintained so as to point to any larger children thereof. The left pointer of the node associated with the previous position is examined to determine if it has a child node.

If any child node was determined to exist, the child node and the string it represents is selected for comparison with the string of the root node and the process repeated until a leaf node is reached. The tree is thus split based on the relative value of the current position in the data stream. By inserting new nodes as root nodes for the most recent character strings, the tree is temporally ordered whereby traversing the tree traverses nodes of increasing offset. As can be appreciated, such an ordering facilitates the return of the longest match having the smallest offset when the tree is searched.

Other objects and advantages will become apparent from the following detailed description when taken in conjunction with the drawings, in which:

BRIEF DESCRIPTION OF THE DRAWINGS

FIG. 4 is a flow diagram representing the general steps taken to search and insert a search term into a temporally ordered binary search tree in accordance with one aspect of one aspect of the present invention;

DETAILED DESCRIPTION OF THE PREFERRED EMBODIMENT

Figure 2:
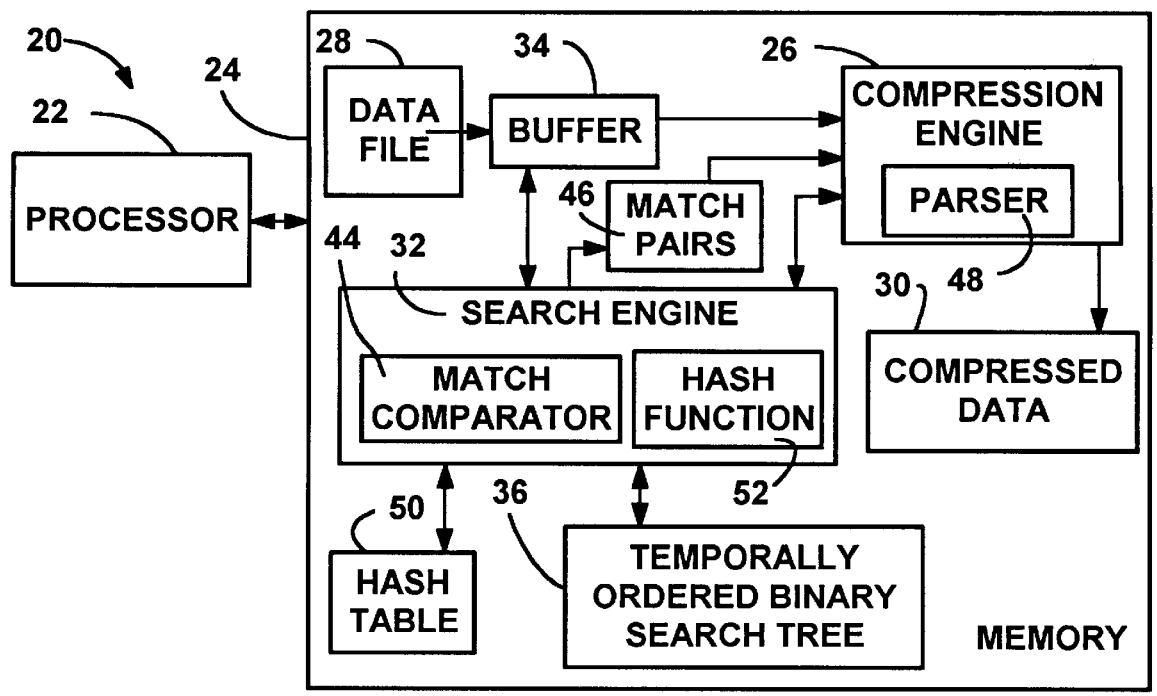
FIG. 2 is a block diagram representing a computer system into which the present invention may be incorporated.

Turning to the drawings and referring first to FIG. 2, there is shown a computer system generally designated 20 into which the present invention may be incorporated. Generally, the computer system 20 is a relatively high-powered computer including a processor 22 and a memory 24, which is preferably running a data compression engine 26 to encode a stream of data in one or more files 28 into one or more compressed files 30. However, it is understood that the computer system 20 can comprise virtually any system and run other programs which employ the search system and method of the present invention described herein. For example, instead of using the search system and method for data compression, the system and method can be incorporated into or used by a database search engine.

The memory 24 includes random access memory and/or non-volatile storage, which, as understood, can together comprise a large amount of virtual memory via swapping techniques. However, as can be appreciated, for purposes of speed it is desirable to maintain as much information as possible in random access memory to minimize or avoid swapping.

With LZ77-based compression, the data compression engine 26 employs a search engine 32 to search a stream of data in a history buffer 34 of previously processed data. The search engine 32 may be a separate program, file, object or the like or may be incorporated as a routine into the compression engine 26.

Figure 3:
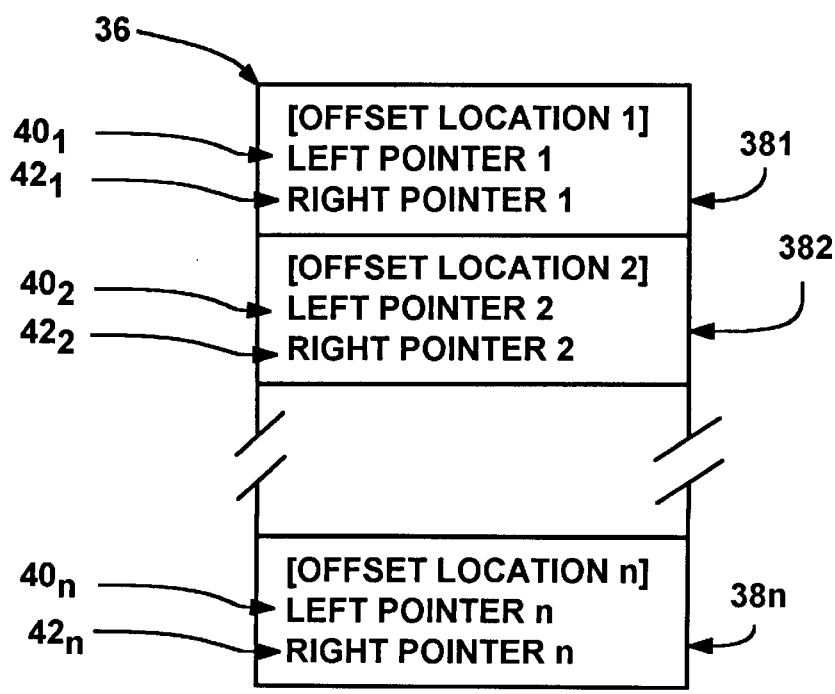
FIG. 3 is a block diagram representing information stored in association with nodes of a search tree.

In accordance with one aspect of the invention, the search engine 32 creates, restructures and references in the memory 24 a temporally ordered binary tree 36. As best shown in FIG. 3, the tree 36 comprises a plurality of nodes $38_1$–$38_n$, each node including a reference to a location in the data stream and a left and right pointer $40_1$–$40_n$, $42_1$–$42_n$, respectively, to respective left and right child nodes thereof, if any. The reference to the location in the data stream may correspond to the relative address of the node in the memory 32, or may be stored as separate variables in the various nodes $38_1$–$38_n$.

As will be described in detail below, the nodes in the binary tree are temporally ordered in that each new node added to the tree is added as a new root node of the tree 36, which replaces the former root node. The other nodes in the tree are propagated downward in a left or right child subtree depending on their relative values with respect to the new root node. As a result, the most-recently added nodes are closer to the top of the tree than those added later. Significantly, as the tree is restructured based on the new root node, the temporal order is preserved in that no node in the tree contains a former parent node its child subtrees. With LZ77-based compression, the nodes with the smaller offsets from the current data stream location are thus searched before nodes with larger offsets. Consequently, as will become apparent below, the tree is only traversed once (at order approximating/approaching O[log(n)]) to find the longest match with the smallest (closest) offset.

Figure 5A:
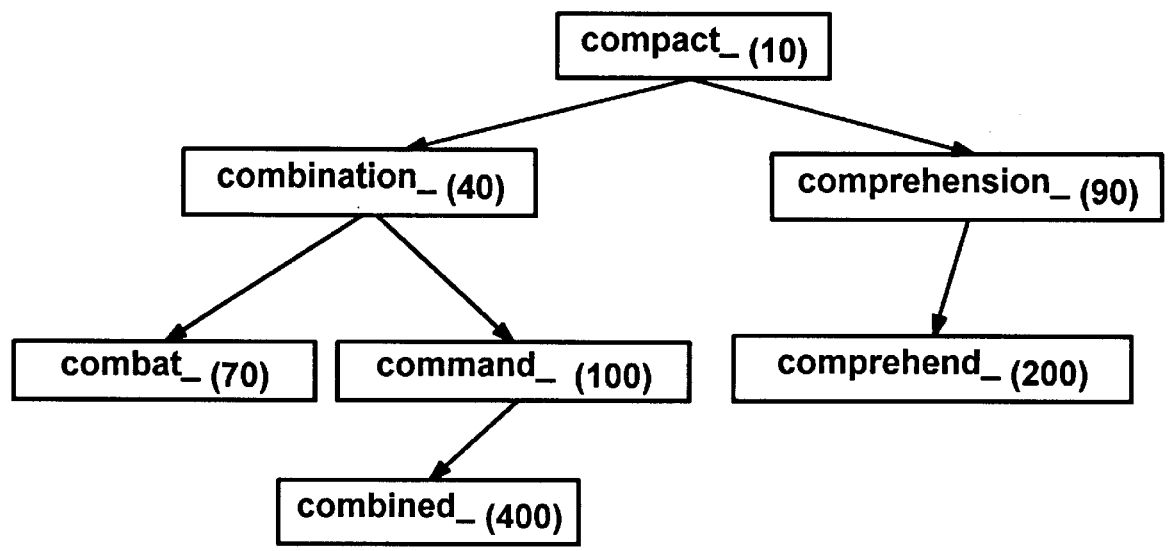
FIGS. 5A–5I represent the node structure of a temporally ordered binary search tree as a new node is inserted into the tree in accordance with the invention.

Turning to an explanation of the operation of the invention, FIG. 4 represents the general steps for searching and contemporaneously inserting a new node into the temporally ordered binary search tree 36 by root replacement. FIG. 5A represents a temporally ordered binary search tree such as the tree 36 having a few temporally ordered nodes already present therein. Note that while FIGS. 5A–5I are based on alphabetic comparisons for purposes of determining branch direction, (e.g., ASCII values with case normalization or the like determine whether one string is greater than another), it is understood that the invention functions with numbers or strings of symbols of other hierarchical organization, as long as values associated therewith can be compared such that one can be "larger" than the other.

By way of example, a new node, known as the target node, associated with the current location in the data stream and having a relative value of "combine_" is to be searched and inserted into the tree of FIG. 5A. Note that in FIGS. 5A–5I and the accompanying description thereof, each underscore character represents a space character and each parenthetical value represents the offset from the current position, e.g., zero for the target node. Of course, instead of ending with a space character, each node typically represents a character in the data stream and all subsequent characters thereafter to the end of the stream (or some other maximum point). In keeping with the invention, the target node, which will be the closest node to the current position in the data stream, will be logically inserted at the root (top) of the tree and the tree will continue to be temporally ordered.

To accomplish the search and/or root replacement insertion operation, at step 400 of FIG. 4, a variable, search_ptr, is set equal to the (current) root node of the search tree, which at present has a relative value of "compact_" (FIG. 5A). Since the tree is temporally ordered, the current root node of value "compact_" has a higher offset (equal to ten in this example) than the string at the current position, "combine_" (offset zero). The target node then commences a search of the existing tree starting from the node of value "compact_."

Figure 5B:
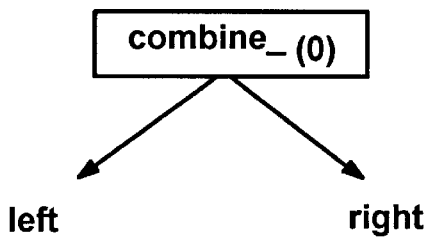

Step 402 creates the new node (of relative value "combine_") in the memory 24 for the current position in the data stream, CP, as represented by FIG. 5B. A left and right pointer are also allocated at this time for the new node, but for the moment are null, since the node to which each will point (if any) has not yet been determined. The left pointer indicates a child subtree in the new tree and is reserved for nodes which are smaller than the target node (the root node of the new tree). Similarly, the right pointer is for a child node and its subtrees which will be larger than the target node.

Step 404 determines if the search_ptr is beyond the maximum offset, i.e., if the node presently being checked corresponds to a location in the data buffer 34 that is beyond the limits of a given search. For example, as is known in LZ77-based data compression, a history window of finite size is specified beyond which string matches are no longer searched. Note that with the maximum offset test, no special steps need to be taken to delete nodes from a temporally ordered tree, since once a node is beyond the maximum offset limit no further comparison with that node or children thereof (which will have even larger offsets) is necessary. Thus, a node indicated by search_ptr and any children nodes thereof can be reclaimed in memory for use by other nodes whenever step 404 indicates that search_ptr is beyond the maximum offset. Note that step 404 is not necessary to the invention, and can be eliminated or disabled if a particular application does not desire a finite history buffer. Of course, in such an instance, some other test is necessary to end the loop.

As shown in FIG. 4 and described in detail below, steps 404–412 are repeated until the search_ptr exceeds the maximum offset and/or until a leaf node is reached. As will become apparent, as the loop is repeated, the target node becomes the new root, and the tree is searched and restructured based upon the relative value of the new node. More particularly, the tree is split according to the relative value of the string represented by the target node with respect to the other nodes of the tree. However, in keeping with the invention, as the tree is restructured, the order of the tree is preserved such that traversing the tree traverses nodes of increasing offset from the current position in the data stream.

To perform the search, each time through the loop, step 406 determines, via a match comparator 44 (FIG. 2) operating in a known manner, the match length of the string beginning at CP (corresponding to the target node of value "combine_") with the strings in the tree 36. The comparison initially begins at the search_ptr location corresponding to the former root node, (e.g., value "compact_"), and thus determines a match length of three. In one embodiment, the longest match length is obtained by comparing the match length at CP with a single stored current maximum match length, (each time through the loop), and keeping the larger of the values as the current maximum match length. The offset is maintained as a pair in conjunction with the current maximum match length. Consistent with LZ77-based encoding, because the tree traverses nodes of increasing offset, only when the match length is greater than the previously-stored value is the match length changed, thereby maintaining the smaller of the two offsets when two match lengths are equal. Thus, in this embodiment, the (offset, length) pair is returned by the search engine 32 with the longest match value of smallest offset. Of course, in the situation where a data-compression encoder is invoking the search algorithm, the returned pair may be discarded if a more efficient way of representing the data is available (e.g., if the maximum match length is one).

In an alternate embodiment, a plurality of distinct match lengths and closest offset pairs 46 may be maintained in a table or the like as the tree is traversed. For example, as is typical in LZ77 compression, minimum and maximum match lengths may be specified. If a minimum match length is two and a maximum match length is ten, then the search engine of the present invention may return a set of pairs comprising a closest offset, match length pair for each match length from two to ten. A parser 48 or the like can examine the various pairs in conjunction with previously returned sets of pairs to determine which of the permutations provide more-optimal compression. For example, it may be more efficient to encode a ten character string as two strings of match length five with small offsets, instead of one string of match length ten having a larger offset.

Figure 1:
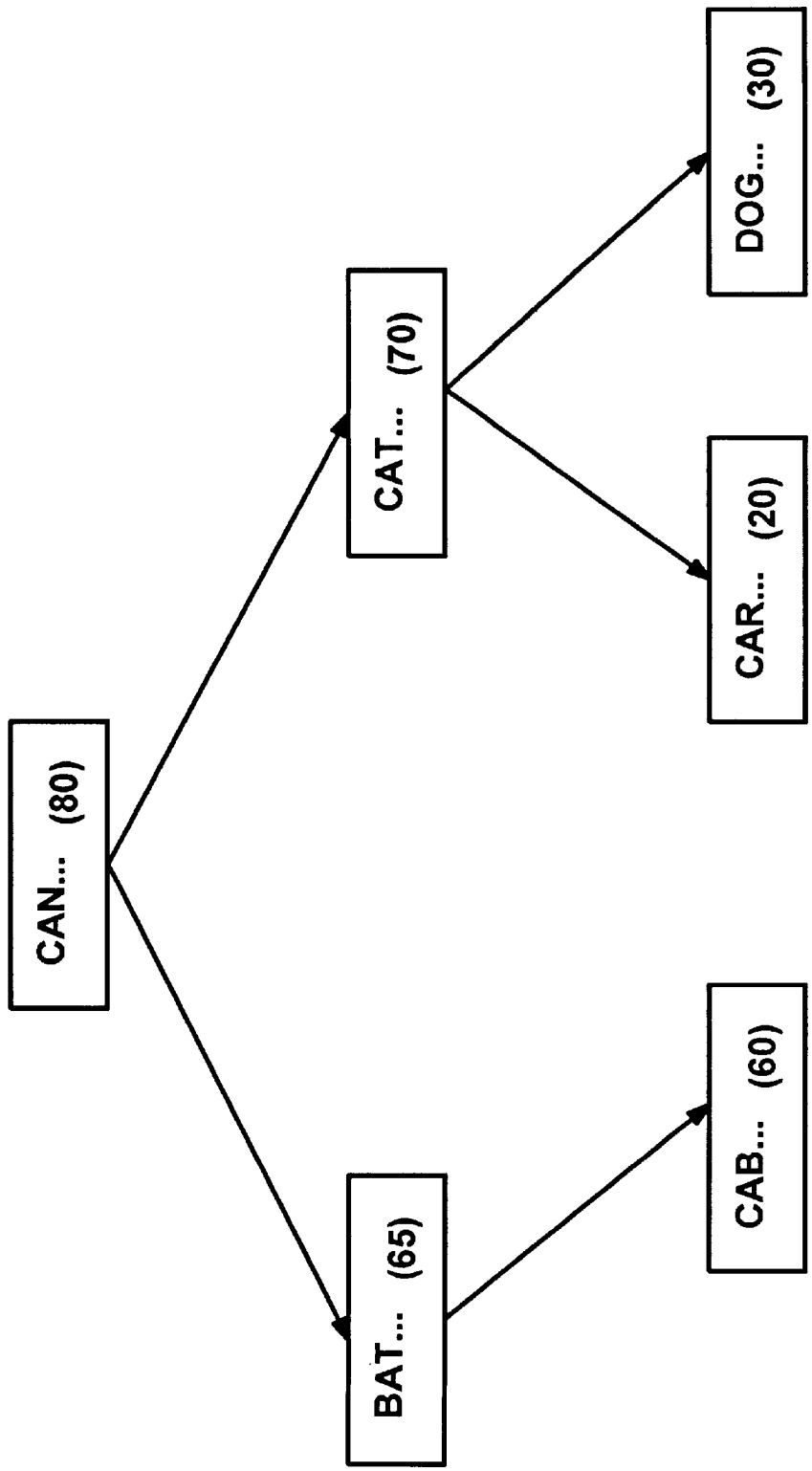
FIG. 1 is a representing an exemplary binary search tree according to the prior art.

Thus, although not necessary to the invention, via step 406 the search engine 32 described herein thus has the capability of rapidly providing one or more closest offset, match length pairs if desired. Note that returning multiple pairs falls directly out of a single search of the temporally ordered tree. In contrast, locating such a set of pairs using a conventionally-ordered tree would be an extremely complex task. Indeed, not only would multiple branches of a conventional tree need to be searched to find the closest offset of a given match length, (e.g., see FIG. 1 and the previous description thereof), but each match length in a range would have to be individually tracked and searched.

Figure 5C:
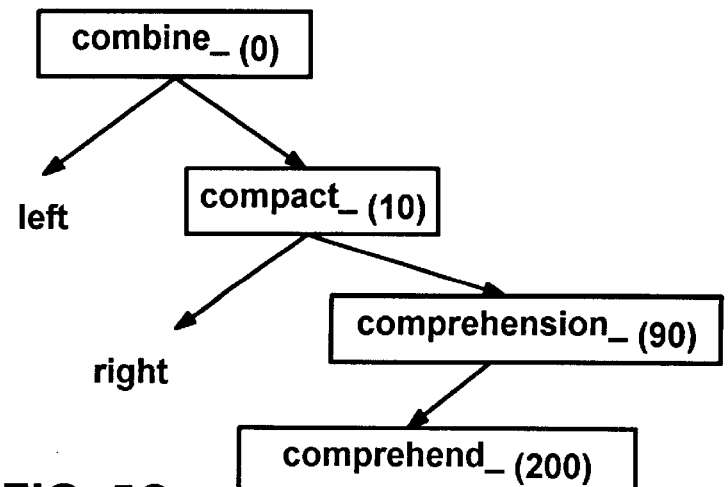

Step 408 performs the comparison to determine whether the left or right pointer of the target node (i.e., value "combine_") will point to the node that was formerly at the top of the tree i.e., value "compact_"). The branching directions are arbitrary, as branching right may mean either larger or smaller depending on how selected, although in this example and hereinafter, right means larger. Thus, in this instance, the target value of "combine_" is less than "compact_" and the process accordingly branches to step 410 where the right pointer of the target node points to the node symbolized by the relative value of "compact" and any larger (right) children nodes thereof ("comprehension_" and "comprehend_") as shown in FIG. 5C. This is possible since any nodes larger than "compact_" are of course also larger than "combine_" and the search will not progress down that path. Had the value been less than "combine_", e.g., "coma_," then the left pointer would have pointed to that node and any smaller child subtrees thereof.

Figure 5D:
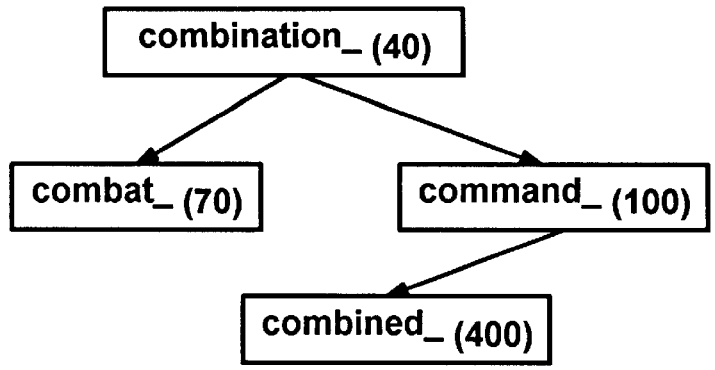

Step 410 then changes the right pointer variable for pointing to the left (smaller) children of the search_ptr node, i.e., of value "compact_" so that the tree will be properly restructured based on the values of the remaining nodes as the search traverses the tree. FIG. 5C shows the partially restructured tree at this instant, with the values of the two variables named left and right still to be determined for the left branches of the nodes of relative values "combine_" and "compact_," respectively. Lastly, step 410 changes the search_ptr to the next node to be evaluated in the search, i.e., the node of relative value "combination_" as shown in FIG. 5D. The process then loops back to step 404.

Figure 5E:
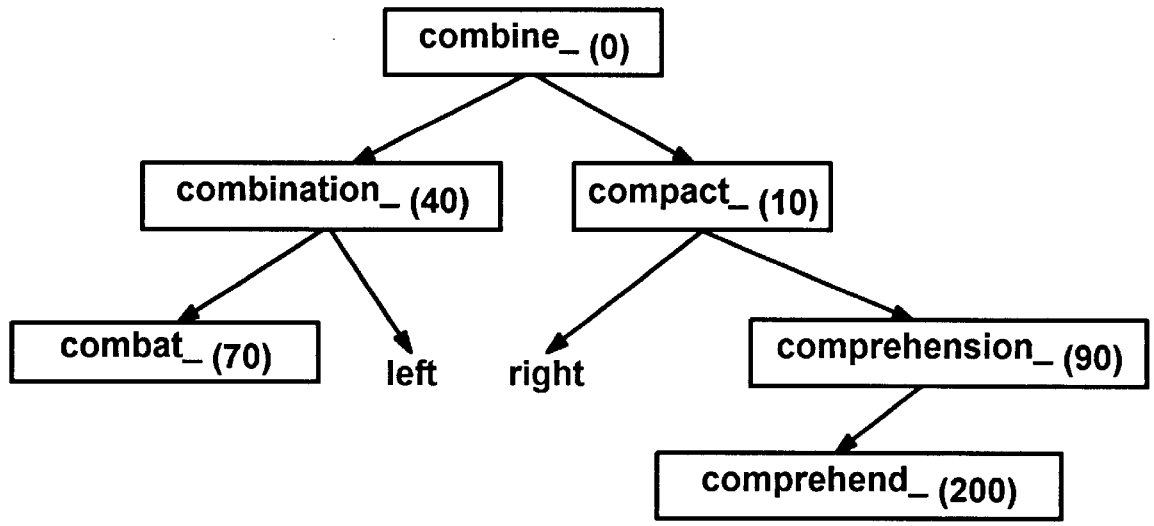
Figure 5F:
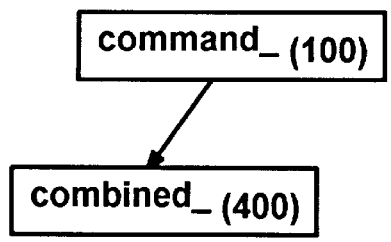

As can be appreciated by following the steps of FIG. 4 in conjunction with FIGS. 5C–5I, steps 408 and 412 are executed the next time through the loop, (after obtaining the match length of six at step 406), since the target node of value "combine_" is greater than the node of relative value "combination_" (FIG. 5D). From step 412, the node representing "combination_" is pointed to by the left pointer of the node representing "combine_." By maintaining the value of the left pointer in the node of value "combination_," the smaller subtrees or children of that node (i.e., the node of value "combat_"), remain at the left side of the tree as shown in FIG. 5E, since such nodes are known to be smaller in relative value than "combine_." Also at step 412, the left variable is moved to the right branch of the "combination_" node for pointing to a subsequently-located node, (or nodes), if any, having a relative value between "combine_" and "combination_." Lastly, the variable search_ptr is set to the next node to be searched, the "command_" node as shown in FIG. 5F. The process again loops back to step 404.

Figure 5G:
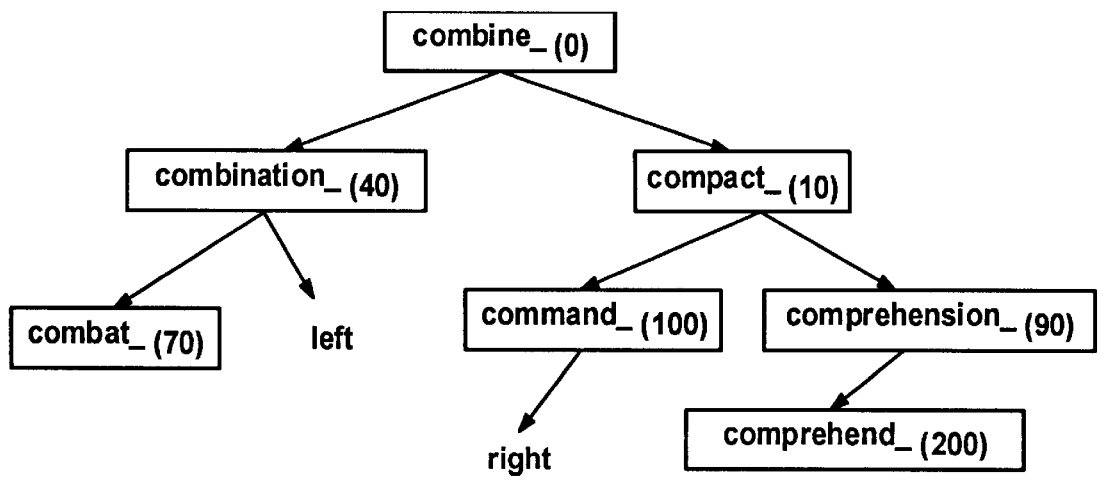
Figure 5H:

Assuming the maximum offset is not exceeded, the next time through the loop, the match length is obtained at step 406 by comparing the string associated with the target node to the string associated with the node indicated by search_ptr of value "command_." Then, at step 408, since "command_" is larger than the target value of "combine_," the right pointer (presently at the left branch of the node of value "compact_") points to the "command_" node at step 410. The right pointer is then moved to the left child of search_ptr, i.e., the left branch of the "command_" node as shown in FIG. 5G. Lastly, the search_ptr variable is changed to represent the node that was at the left branch of the node of value "command_", i.e., the node of relative value "combined_" as shown in FIG. 5H.

Figure 5I:
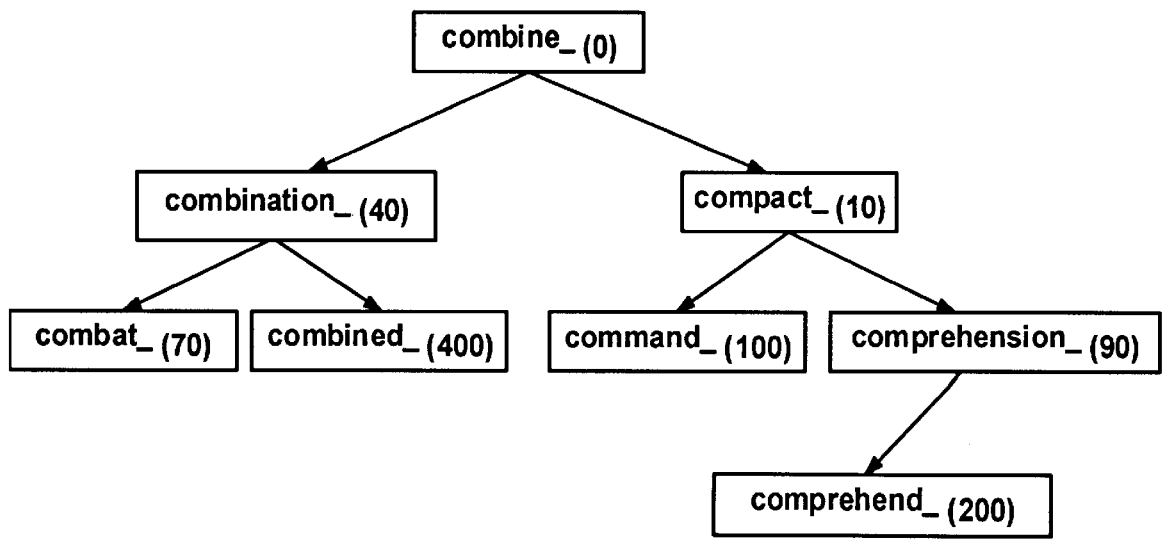

As can be appreciated by following the steps of FIG. 4, the leaf node of value "combined_" is placed at the right branch of the "combination_" node. FIG. 5I shows the reconstructed tree after the "combined_" leaf has been reached and evaluated. Note that the loop can be exited at step 404 by changing search_ptr to a value larger than the maximum offset allowed when no left child exists (for search_ptr to represent) at step 410 or when no right child exists at step 412. At this time, the left and right pointers, set for pointing to the right of "combined_" and the left of "command_," respectively, are set to nil at step 414 since the "combined_" and "command_" nodes are leaf nodes.

In this manner, as shown in FIG. 5I, the tree is properly restructured based upon the new root node representing "combine_." Significantly, the temporal order of the tree is preserved, as no node in the resulting tree contains a former parent in any of its child subtrees. The tree is only traversed once at order approximating/approaching O(log(n)) to locate the closest offset, longest match length pair or pairs.

Figure 6:
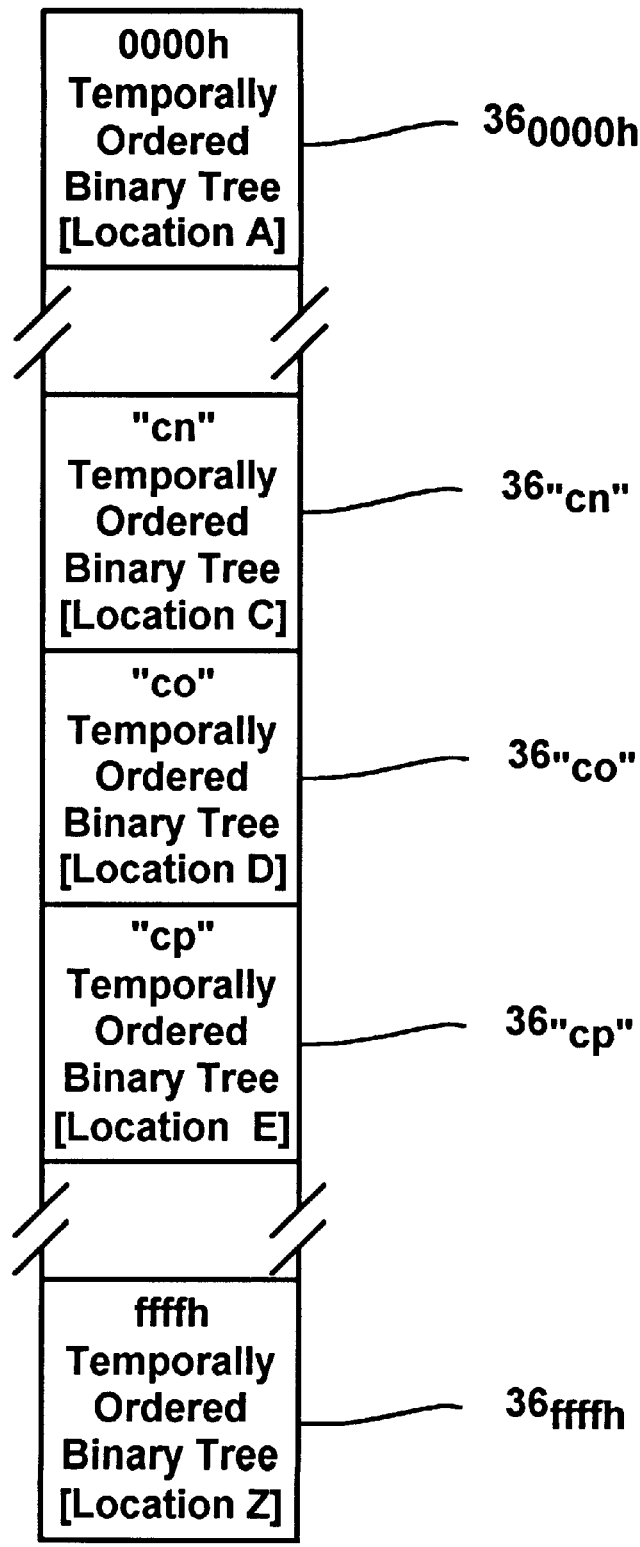
FIG. 6 is a representation of a number of temporally ordered binary search trees indexed by a hashing function in accordance with an alternate aspect of the invention.

In an alternate embodiment, the temporally ordered binary search tree engine 32 may be further optimized to provide even greater performance. More particularly, rather than having a single tree for representing the history window, a number of effective trees $36_{0000h}$–$36_{ffffh}$ may be provided such as shown in FIG. 6. Each of the trees $36_{0000h}$–$36_{ffffh}$ are hash-indexed by the first two characters in a given string. In other words, a hash table 50 and hash function 52 is provided to track the closest location in the data stream of the root node of each unique two character permutation, such that effectively there will be a temporally ordered tree for strings beginning with "aa" and another for "ab" as long as an occurrence of those two character combinations have been previously located in the data stream. As described below with reference to FIGS. 7A–7B, the starting node for any string can quickly be located by a hashing lookup operation. Of course, it can be appreciated that more than two characters may be used as an index.

However, the use of two characters provides $2_{16}$ combinations of one-byte character values, enabling sixteen bit hash values for looking up the correct tree. One character can also be used for hashing, as described in more detail below.

Yet another enhancement provides still faster searching as also described below with reference to FIGS. 7A–7B. In this alternate embodiment, as the search traverses the temporally ordered binary search tree, match lengths are maintained for the strings corresponding to the most-recently compared node which is larger and the most-recently compared node which is smaller than the target node. As described in more detail below, at least the lesser of these match lengths (e.g., n characters) is known to be common in any strings represented by nodes in their subtrees. Then, the confirmed match length portion (length n) of the string represented by any child node need not be compared with the first n characters of the string represented by the target node since those n characters are known to match, saving additional character-comparison time. This enhancement is known as progressive string search narrowing since the search tends to progressively converge to a given range of values as the tree is traversed.

Figure 7A:
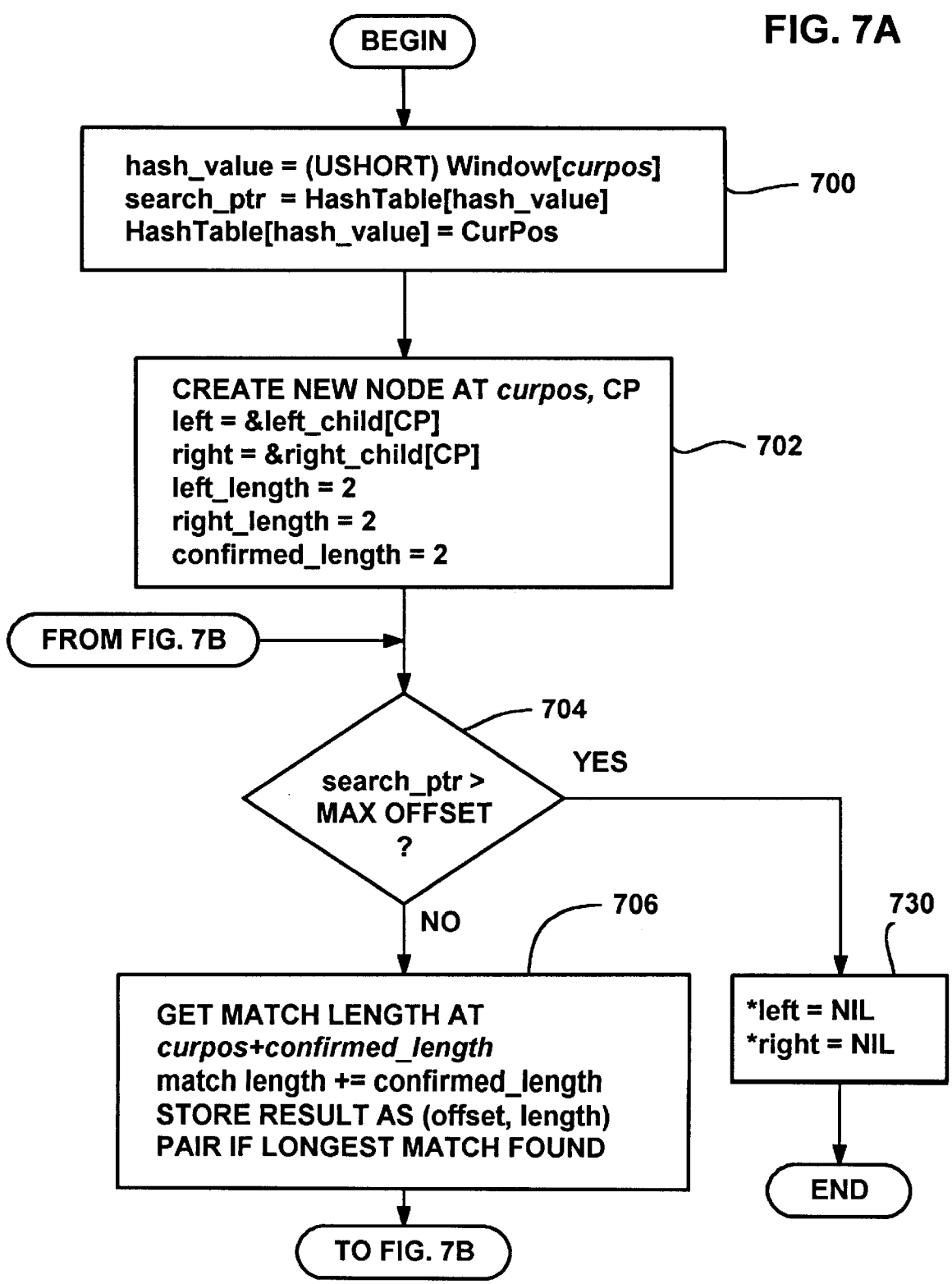
FIGS. 7A–7B comprise a flow diagram representing the general steps taken to search and insert a string into a hash-indexed temporally ordered binary search tree, with additional steps for reducing string comparisons.
Figure 7B:
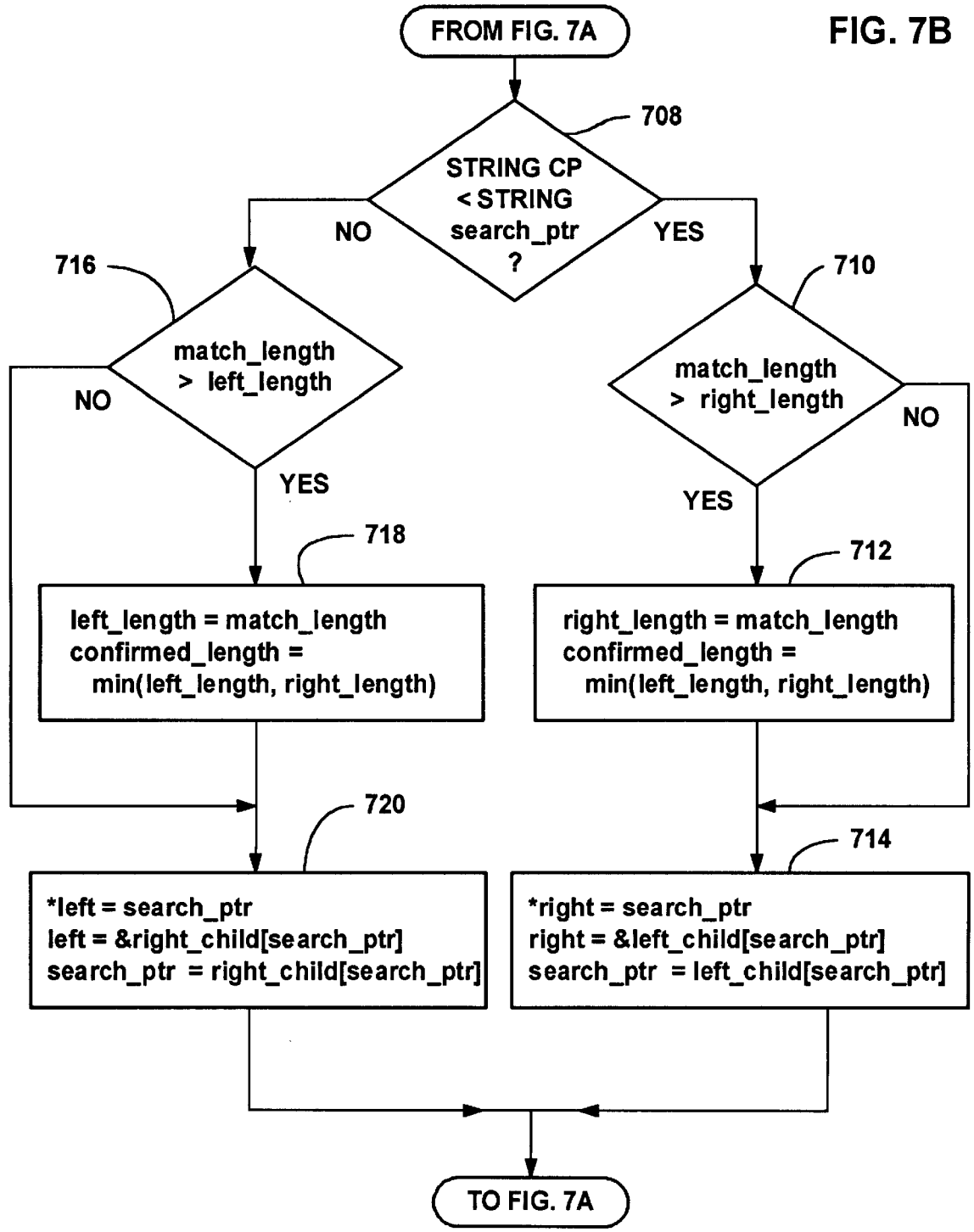
Figure 8A:
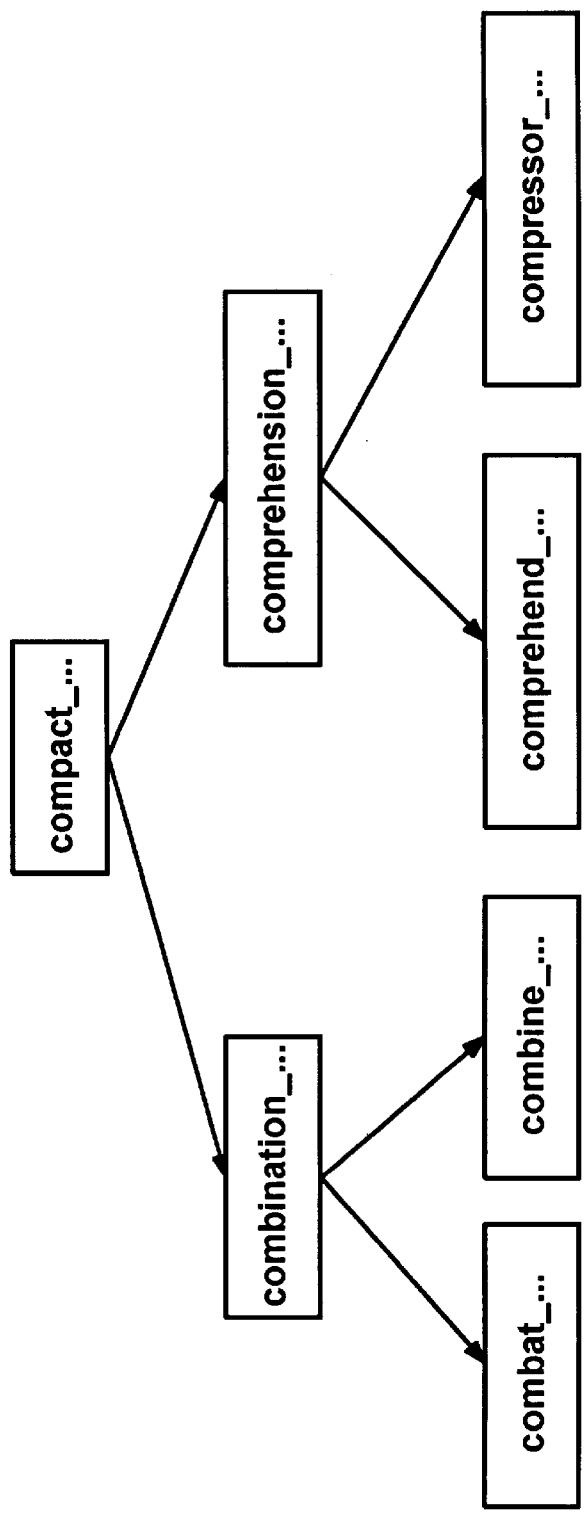
FIGS. 8A–8G represent a structure of a temporally ordered binary search tree as a new node is inserted into the tree in accordance with the general steps of the flow diagram of FIGS. 7A–7B.

The combination of using a hashing index and progressive string search narrowing is shown in the flow diagram of FIGS. 7A–7B. The flow diagram of FIGS. 7A–7B is explained with reference to the temporally ordered search tree of FIGS. 8A–8G, which, in keeping with the example, is the tree $50_{"co"}$ (FIG. 6) hash-indexed by the first two symbols "co" (lowercase). In the example, it is assumed that the tree is to be searched with the string "compression . . . ," and that all nodes presently in the "co" tree $36_{"co"}$ of FIG. 8A are temporally ordered (lowest offsets closest to the root) and within the allowed window.

Beginning at step 700, the hash value is set to the two symbols of the string from the current position, curpos, i.e., "co." The hash function 52 to obtain this value places the current data stream symbol in the upper eight bits of a sixteen bit variable and the next symbol thereafter in the lower eight bits, i.e., HashValue=(USHORT) (enc_MemWindow[CurPos]<<8)+enc_MemWindow[CurPos+1].

The search_ptr variable, analogous to that described above, is set to the uppermost node of the temporally ordered tree $36_{"co"}$ that is indexed by that hash value, i.e., the node that corresponds to "compact_ . . . " in the data stream, where the underscore character represents a space. Lastly, at step 700 the "co" hash table entry is changed to point to the new, closer offset target node, in this example the position in the data stream where the string "compression_ . . . " begins so that the "co" tree $38_{"co"}$ will now have its root associated with this closer location.

Figure 8B:
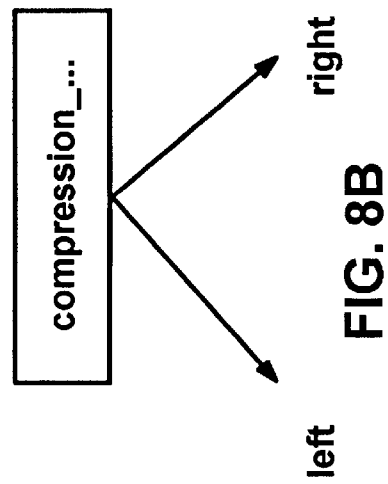

At step 702 new node is created in memory to represent the current position (curpos), CP. As shown in FIG. 8B, a left variable and right variable are allocated for the left and right child branches of the target node CP. At this time, it is known that any nodes in the "co"tree smaller than the target node value ("compression_ . . . ") at least have match lengths of two, and thus a left_length variable is set to two to track the smaller node's match length. Similarly, at step 702, a right_length variable is set to two for any larger node's match lengths. Lastly, at step 702 a confirmed_length variable, which tracks the minimum of the left_length and right_length variables, is set to two to represent the minimum.

The loop begins at step 704 wherein the search __ptr is compared against the maximum offset as described above with reference to step 404 of FIG. 4. If the maximum offset is exceeded, the loop is exited and the process ends as described below with reference to step 730. However, for purposes of this example the maximum offset is not exceeded at this time.

Thus, step 706 is executed and determines the match length (equal to four) beginning at the current position plus the confirmed length, in this instance two characters beyond the current position. As described above, the first two characters are not compared, (as the confirmed length is two), because all nodes in the "co" tree are known to have at least "co" in common at this time. As described above with reference to step 406 of FIG. 4, the offset, length pair is saved if it is greater than a previous match length. Again, the largest of all match lengths can be returned with a corresponding offset value, or a plurality of distinct match lengths (e.g., match length two up to match length ten) can be returned with corresponding offset values for subsequent parsing. In such an event, the closest offset match length is maintained in conjunction with each distinct match length in the set of pairs 46.

Step 708 (FIG. 7B) compares the value of the string of node CP ("compression__ . . . ") with the string of the search_ptr ("compact__ . . . "). Since "compression__" is greater than "compact__," the process branches to step 710 where the match length (equal to four) is compared against the left_length (equal to two). Since the match length of four is greater than the previous left_length value of two, the left_length variable (for tracking the lesser nodes) is set to the greater value of four at step 712. Also at step 712, the confirmed_length is set to the minimum of the left and right length variables, and thus remains at two.

Figure 8C:
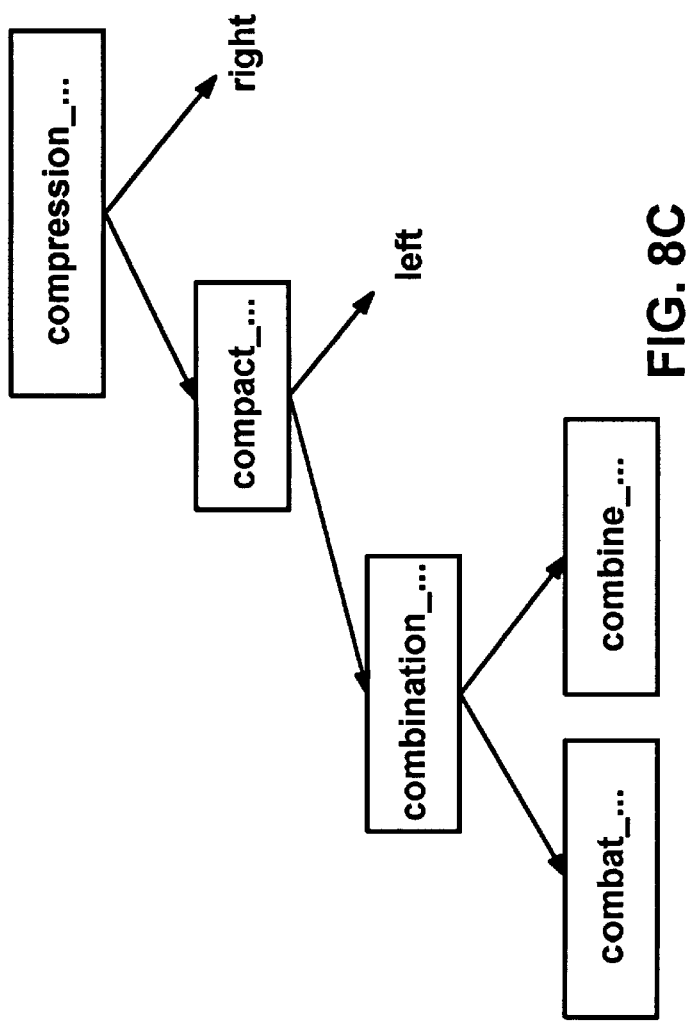
Figure 8D:
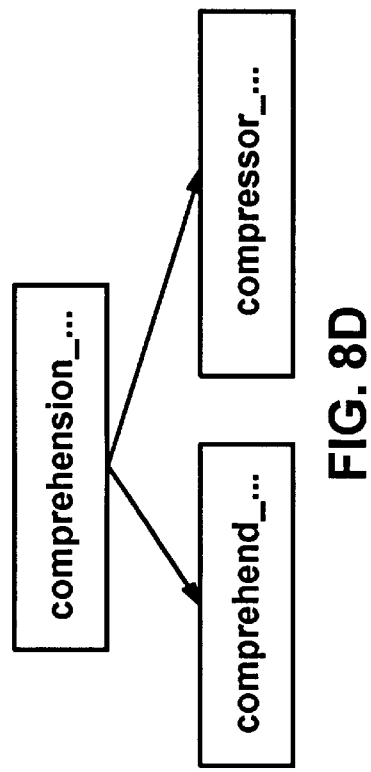

At step 714, the left pointer of the target node ("compression__ . . . ") of FIG. 8B is set to point to the search_ptr ("compact__ . . . ") node as shown in FIG. 8C. As also performed at step 714 and shown in FIG. 8C, the left variable is moved to point to the right of the search_ptr node ("compact__ . . . "). Lastly, at step 714, search_ptr is changed to point to the next node to be searched, "comprehension__ . . . " as shown in FIG. 8D. The process then returns to step 704 of FIG. 7A.

Again, in this example the maximum offset is not reached at step 704, and thus step 706 is executed wherein a match length of six is obtained and stored in conjunction with the relative offset of "compression__ . . . " in the data stream. Note that the string comparison to obtain the match length began two characters past "comprehension__ . . . " and "compression__ . . . " since the confirmed length was two, i.e., the comparison began at "mp . . . " of each string.

Figure 8E:
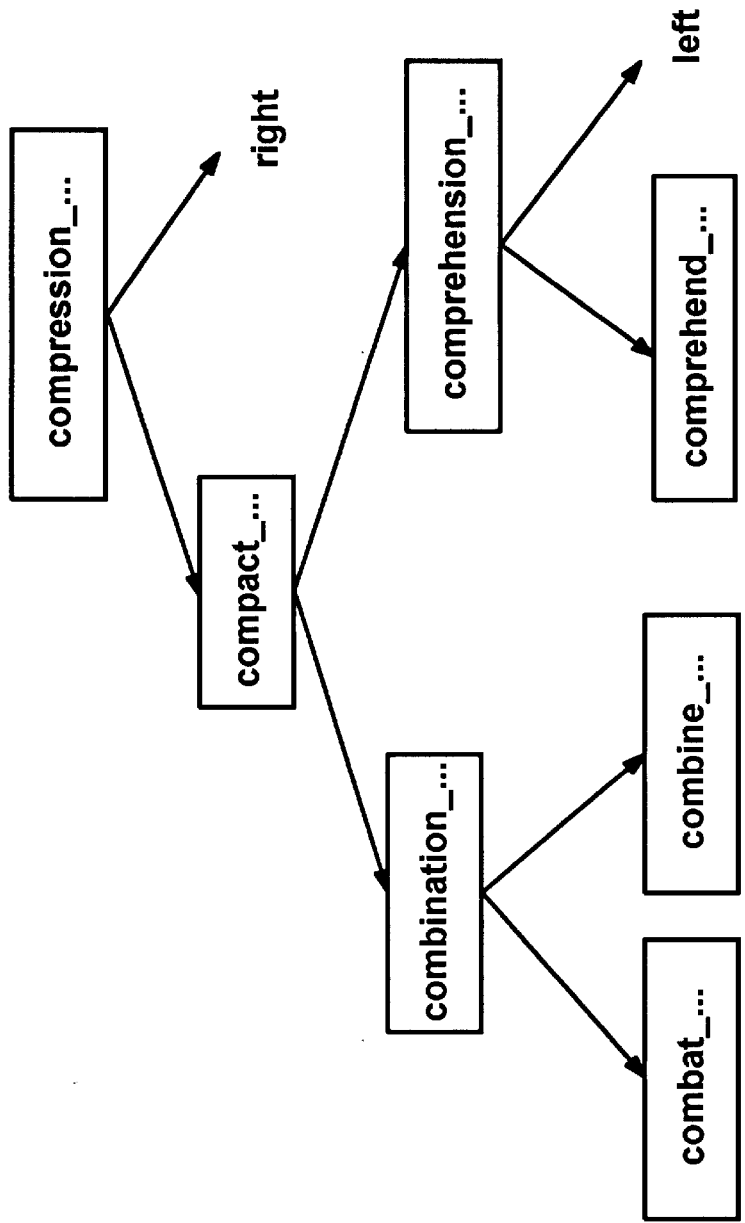
Figure 8F:

Since "compression__ . . . " is not less than "comprehension__ . . . ," at step 708 the process again branches to step 710. As can be appreciated, since the match length of six is greater than the left_length of four, step 712 is executed whereby the left_length is changed to six and the confirmed length remains at two. At step 714, the search_ptr node "comprehension__ . . . " and the lesser subtrees thereof, i.e., "comprehend__ . . . ," are pointed to by the left variable, that is, they are placed under the right branch of the "compact__ . . . " node as shown in FIG. 8E. The left pointer is then moved to the right branch of comprehension__ . . . and the search_ptr variable is changed to indicate the node representing the string "compressor__ . . . " in the data stream, as shown in FIG. 8F. The process then returns to step 704 of FIG. 7A, where the node for the string "compression__" is evaluated against the maximum offset and found to be in range.

As can be appreciated, step 706 finds a match length of eight for the string "compressor__ . . . " when compared with the string "compression__ . . . ," and thus the match length, offset information is stored for this node. This time through the loop however, since "compressor__ . . . " is greater than "compression__ . . . ," step 708 branches to step 716. As similarly desribed above, with this string, the right_length of two is changed to the match length of eight by steps 716 and 718, and the confirmed_length (currently two) is increased to the minimum of the left_length and right_length variables, in this instance six. Further string comparisons, if any, will now start six characters into the string since any node greater than "comprehend__ . . . " and less than "compressor__ . . . " will have at least six characters in common with "compression__ . . . ," the target node. Note that if instead of "compressor__ . . . " the string was "continent__ . . . ," having a match length of two, step 718 would be bypassed and the right_length and the confirmed_length values would have both correctly remained at two.

Figure 8G:
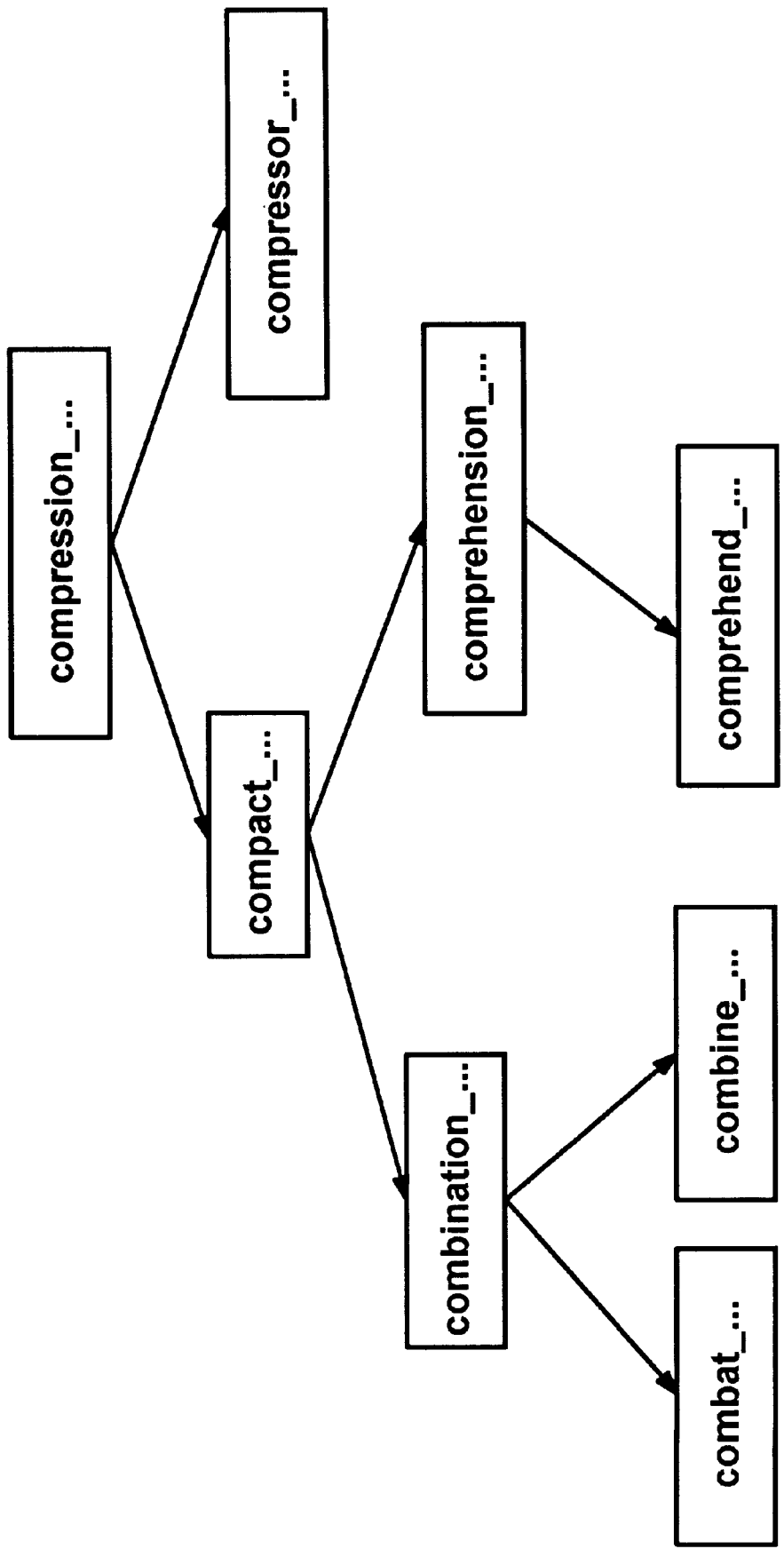

Lastly, step 720 adjusts the right pointer of the target node such that "compressor__ . . . " is under the right branch of "compression__ . . . " as shown in FIG. 8G. Since "compressor__ . . . " is a leaf node, there are no further nodes to search. Accordingly, to end the loop, the search_ptr value can be set to exceed the maximum offset whereby step 704 will branch to step 730. The left and right pointers will be set to nil at step 730, after which the restructured tree is logically organized as in FIG. 8G. As can be seen, the tree 36$_{"co"}$ remains temporally ordered as the node with the closest offset is added as the new root of the tree, and no nodes have former parents in subtrees thereof. At the same time, the tree is properly organized in terms of relative values based on the value of the new root node.

As before, the new node is inserted while the search takes place, and rapidly returns one or more offset, match length pairs. By tracking the confirmed length as the minimum of the maximum match lengths of the larger and smaller nodes, the string comparisons get progressively narrower as eventually more and more characters are (ordinarily) skipped in the comparison by the match comparator 44. This is particularly useful when searching data having frequent, long matches, such as text data. Indeed, in a typical text file, the number of actual characters compared during the search can be reduced by fifty percent.

At the same time, the two-character hash function quickly finds the proper root node to expedite the search, which can provide significant time savings. By way of example, assume a data stream has a uniform distribution of characters therein. If a compression window of size $2^{20}$ characters is used, an average conventional binary search would take 20 iterations. However, if a hash table of $2^{16}$ pointers to two-character combinations is used to first locate the appropriate root node, the average search will take only four iterations. Of course, such an optimal distribution is unlikely to ever occur, but nevertheless, significant improvement is still obtained with typically distributed data files.

Note that a one-character hash function indexing scheme may be alternatively implemented instead of a two-character scheme. With a one-character function, using eight-bit characters, only (up to) 256 tree root pointers need be maintained. As can be appreciated, other than simplifying the hash function to a straight lookup, to implement a one-character indexing scheme, only a few changes to the flow diagram of FIGS. 7A–7B are necessary, including initializing the left_length, right_length and confirmed_length variables to one (instead of two) at step 702. A one-character hash function indexing scheme provides a fair performance increase without requiring much additional memory.

In keeping with the invention, the temporally ordered binary search tree thus provides significant advantages with LZ77-based compression encoding. Whether the process of FIG. 4, FIGS. 7A–7B or some other related process is used, the temporally ordered binary search tree provides a structure for a search engine to rapidly return the smallest offset, maximum match length pair via a binary search. Further, multiple match length, offset pairs can be returned for subsequent parsing as described above.

Moreover, other search applications can benefit from the temporally ordered search tree. For example, a static database search can be improved by relocating the most recently queried nodes towards the root of the tree by searching and replacing the root node as described above. Still further, data can be added to a search tree root, whereby a query will return the most-recently added material that matches the search criteria.

As apparent from the above-description, by searching for keywords while replacing the root with the search keyword node, the most-commonly queried keywords will, over time, propagate to the root of the tree. As can be appreciated, with large trees this is highly desirable since, for example, the portion of the tree nearest the root may be stored in random access memory (and possibly in even faster cache memory) while the lower, less frequently queried terms may be maintained in swap files on a disk.

As can be seen from the foregoing detailed description, there is provided an improved binary search method and system and an improved binary search tree. The method and system facilitate LZ77-based data compression, as a single search of a binary tree returns the largest match length with the closest offset. Moreover, more than one match length and corresponding offset can be returned. The method and system function efficiently and rapidly with search windows having relatively large sizes, and are flexible and extensible while providing for enhancements and optimizations.

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. A computer-readable medium having computer-executable instructions for performing steps to restructure an existing tree of nodes, wherein each node is associated with a position in the stream of data and has a first and a second directional pointer associated therewith, and each position in the stream of data has a relative value associated therewith, the steps comprising:

(a) selecting a current position in the stream of data that is logically beyond a previous position, the previous position having a node associated therewith that is the root node of the existing tree;

(b) creating a new node associated with the current position in the data stream, inserting the new node as a new root node of the tree independent of the relative value associated with the current position, and associating a first variable with the first directional pointer of the new root node and a second variable with the second directional pointer of the new root node;

(c) comparing the relative value at the current position with the relative value at the previous position, and, if the relative value at the current position is less than the relative value at the previous position, setting the directional pointer associated with the second variable to point to the node associated with the previous position, maintaining the second directional pointer of the node associated with the previous position, determining a child node, if any, that is pointed to by the first directional pointer of the node associated with the previous position, and associating the second variable with the first directional pointer of the node associated with the previous position, and if the relative value at the current position is not less than the relative value at the previous position, setting the directional pointer associated with the first variable to point to the node associated with the previous position, maintaining the first directional pointer of the node associated with the previous position, determining a child node, if any, that is pointed to by the second directional pointer of the node associated with the previous position, and associating the first variable with the second directional pointer of the node associated with the previous position;

and (d) if a child node was determined, changing the previous position to the position associated with the child node and repeating steps (c) and (d).

2. The computer-readable medium of claim 1 having further computer-executable instructions for performing the steps of determining an offset between the current position and the previous position, comparing the offset to a maximum offset value, and performing steps (c) and (d) when the offset does not exceed the maximum offset value.

3. The computer-readable medium of claim 1 having further computer-executable instructions for performing the step of comparing the characters beginning at the current position with the characters beginning at each previous position to determine the match length at each previous position.

4. The computer-readable medium of claim 3 having further computer-executable instructions for performing the step of determining the maximum match length of each of the previous positions.

5. The computer-readable medium of claim 4 having further computer-executable instructions for performing the step of, maintaining the maximum match length in conjunction with the offset of the previous position corresponding thereto.

6. The computer-readable medium of claim 4 having further computer-executable instructions for performing the step of, maintaining a plurality of pairs of match lengths paired with the offsets of the previous positions corresponding thereto.

7. The computer-readable medium of claim 6 wherein steps (a)–(d) are executed by a data compression engine, and wherein the offset, match length pairs are returned to the compression engine.

8. The computer-readable medium of claim 1 wherein a plurality of existing trees are provided, each tree uniquely indexed by at least one character, and having further computer-executable instructions for performing the steps of determining an index based on at least one character beginning at the current position, and selecting a tree based on the index.

9. The computer-readable medium of claim 1 having further computer-executable instructions for performing the steps of tracking a first maximum number of characters which match the current position and a previous position which has a relatively larger value than the value of the current position, tracking a second maximum number of characters which match the current position and a previous position which has a relatively smaller value than the value of the current position, selecting the minimum value of the first and second maximum values, and comparing the characters beginning at the current position plus the minimum value with the characters beginning at each previous position plus the minimum value to determining the match length at each previous position.

10. The computer-readable medium of claim 8 having further computer-executable instructions for performing the steps of, tracking a first maximum number of characters which match the current position and a previous position which has a relatively larger value than the value of the current position, tracking a second maximum number of characters which match the current position and a previous position which has a relatively smaller value than the value of the current position, selecting the minimum value of the first and second maximum values, and comparing the characters beginning at the current position plus the minimum value with the characters beginning at each previous position plus the minimum value to determining the match length at each previous position.

11. A computer-readable medium having computer-executable instructions for performing steps to insert a new node into an existing binary tree of nodes, and for searching the tree with respect to the relative value of a current position associated with the new node, wherein each node is associated with a position in a stream of data and has a first and a second directional pointer associated therewith, and each position in the stream of data represents a string having a relative value associated therewith, the steps comprising:

(a) selecting the node associated with a previous position in the data stream that is logically prior to the current position;

(b) inserting the new node into the tree as a root node independent of the value of the data at the position represented by the new node relative to the value of the data at the position represented by the node associated with the previous position, and associating a first variable with the first directional pointer of the new root node and a second variable with the second directional pointer of the new root node;

(c) comparing the string beginning at the current position with the string beginning at the previous position and providing information of the match length of characters common to each string, and, if the relative value of the string at the current position is less than the relative value of the string at the previous position, setting the directional pointer associated with the second variable to point to the node associated with the previous position, maintaining the second directional pointer of the node associated with the previous position, determining a child node, if any, that is pointed to by the first directional pointer of the node associated with the previous position, and associating the second variable with the first directional pointer of the node associated with the previous position, and if the relative value of the string at the current position is not less than the relative value of the string at the previous position, setting the directional pointer associated with the first variable to point to the node associated with the previous position, maintaining the first directional pointer of the node associated with the previous position, determining a child node, if any, that is pointed to by the second directional pointer of the node associated with the previous position, and associating the first variable with the second directional pointer of the node associated with the previous position;

and (d) if a child node was determined, changing the previous position to the position associated with the child node and repeating steps (c) and (d).

12. The computer-readable medium of claim 11 having further computer-executable instructions for performing the steps of determining an offset between the current position and the previous position, comparing the offset to a maximum offset value, and performing steps (c) and (d) when the offset does not exceed the maximum offset value.

13. The computer-readable medium of claim 11 wherein step (c) is repeated at least twice thereby providing a plurality of match lengths, and having further computer-executable instructions for performing the step of determining the maximum match length of the match lengths provided.

14. The computer-readable medium of claim 13 having further computer-executable instructions for performing the step of maintaining the maximum match length in conjunction with the offset of the previous position corresponding thereto.

15. The computer-readable medium of claim 13 having further computer-executable instructions for performing the step of maintaining the maximum match length in conjunction with the offset of the previous position corresponding thereto, wherein if two match lengths are equal, the maximum match length chosen is the match length maintained in conjunction with the minimum offset.

16. The computer-readable medium of claim 11 having further computer-executable instructions for performing the step of maintaining a plurality of pairs of match lengths paired with the offsets of the previous positions corresponding thereto.

17. The computer-readable medium of claim 16 wherein steps (a)–(d) are executed by a data compression engine, and wherein the offset, match length pairs are returned to the compression engine.

18. The computer-readable medium of claim 11 wherein a table of pointers to the tree is provided, each table entry uniquely indexed by at least one character, and having further computer-executable instructions for performing the steps of determining an index based on at least one character beginning at the current position, and selecting a pointer to the tree based on the index.

19. The computer-readable medium of claim 11 having further computer-executable instructions for performing the steps of tracking a first maximum number of characters which match the current position and a previous position which has a relatively larger value than the value of the current position, tracking a second maximum number of characters which match the current position and a previous position which has a relatively smaller value than the value of the current position, selecting the minimum value of the first and second maximum values, and comparing the characters beginning at the current position plus the minimum value with the characters beginning at each previous position plus the minimum value to determining the match length at each previous position.

20. The computer-readable medium of claim 18 having further computer-executable instructions for performing the steps of tracking a first maximum number of characters which match the current position and a previous position which has a relatively larger value than the value of the current position, tracking a second maximum number of characters which match the current position and a previous position which has a relatively smaller value than the value of the current position, selecting the minimum value of the first and second maximum values, and comparing the characters beginning at the current position plus the minimum value with the characters beginning at each previous position plus the minimum value to determining the match length at each previous position.

21. A computer-readable medium having stored thereon a data structure, comprising:
   a first node comprising data representing a first location in a string of data;
   a second node comprising data representing a second location in a string of data;
   information indicating a parent and child relationship between the first node and the second node, wherein the first node is the parent node and the first location represented thereby is closer in offset than the second location represented by the second node to a search pointer pointing to the string of data, the search pointer moving in one direction as the string is searched; and
   a new root node representing a new location in the string of data that is closer in offset than the first location represented by the first node to the search pointer, and information indicating a parent and child relationship between the new root node and the first node, wherein the new node is the parent node of the first node independent of relative values in the string of data at the locations represented by the new root node and the first node.

22. The computer-readable medium having stored thereon the data structure of claim 21, further comprising, information indicating whether the second node is a left child or a right child of the first node.

23. The computer-readable medium having stored thereon the data structure of claim 21, further comprising, a third node representing a third location in a string of data, and information indicating a parent and child relationship between the first node and the third node, wherein the first node is the parent node of the third node and wherein the first location represented by the parent node is closer in offset than the third location represented by the third node to the search pointer.

24. The computer-readable medium having stored thereon the data structure of claim 23, further comprising, information indicating whether the third node is a left child or a right child of the first node.

25. The computer-readable medium having stored thereon the data structure of claim 24, wherein the information indicating whether the third node is a left child or a right child of the first node indicates that the third node is a left child if data represented by the third node is comparatively less than data represented by the first node.

26. The computer-readable medium having stored thereon the data structure of claim 21, further comprising, a third node representing a third location in a string of data, and information indicating either a parent and child relationship between the first node and the third node or between the new mode and the third node.

27. The computer-readable medium having stored thereon the data structure of claim 21, further comprising, information indicating whether the first node is a left child or right child of the new node.

28. The computer-readable medium having stored thereon the data structure of claim 27, wherein the information indicating whether the first node is a left child or a right child of the new node indicates that the first node is a left child if data represented by the first node is comparatively less than data represented by the new node.

29. The computer-readable medium having stored thereon the data structure of claim 27, wherein the information indicates that the first node is a left child of the new node if data represented by the first node is comparatively less than data represented by the new node, or that the first node is a right child of the new node if data represented by the first node is comparatively greater than data represented by the new node.

30. The computer-readable medium having stored thereon the data structure of claim 29, wherein the information indicates that the second node is a left child or subchild of the new node if data represented by the second node is comparatively less than data represented by the new node, or that the second node is a right child or subchild of the new node if data represented by the second node is comparatively greater than data represented by the new node.

31. A computer-readable medium having computer-executable instructions for performing steps comprising:
   (a) selecting a current position in a stream of data that is logically beyond a previous position, the previous position having a node associated therewith that is the root node of a tree;
   (b) creating a new root node associated with the current position in the data stream; and
   (c) restructuring the tree under the new root node such that i) the node associated with the previous position is a child of the new root node, independent of relative data values at the current position and the previous position in the stream of data, ii) each node that was a parent node of another node is not hierarchically below that other node, and iii) for each parent node having at least at least one child node thereunder, if the parent node has a left pointer to a child node, the pointer points to a child node that has a relative value that is less than the value of the parent node, and if the parent node has a right pointer to a child node, the right pointer points to a child node that has a relative value that is greater than the value of the parent node.

32. The computer-readable medium of claim 31 having further computer-executable instructions for performing the step of comparing the characters beginning at the current position with the characters beginning at each previous position to determine the match length at each previous position.

33. The computer-readable medium of claim 32 having further computer-executable instructions for performing the step of determining the maximum match length of each of the previous positions.

34. The computer-readable medium of claim 33 having further computer-executable instructions for performing the step of, maintaining the maximum match length in conjunction with the offset of the previous position corresponding thereto.

35. The computer-readable medium of claim 33 having further computer-executable instructions for performing the step of, maintaining a plurality of pairs of match lengths paired with the offsets of the previous positions corresponding thereto.

36. The computer-readable medium of claim 35 wherein the offset, match length pairs are returned to a compression engine.

37. The computer-readable medium of claim 31 wherein a plurality of existing trees are provided, each tree uniquely indexed by at least one character, and having further computer-executable instructions for performing the steps of determining an index based on at least one character beginning at the current position, and selecting a tree based on the index.

38. The computer-readable medium of claim 37 having further computer-executable instructions for performing the steps of, tracking a first maximum number of characters which match the current position and a previous position which has a relatively larger value than the value of the current position, tracking a second maximum number of characters which match the current position and a previous position which has a relatively smaller value than the value of the current position, selecting the minimum value of the first and second maximum values, and comparing the characters beginning at the current position plus the minimum value with the characters beginning at each previous position plus the minimum value to determining the match length at each previous position.

39. The computer-readable medium of claim 31 having further computer-executable instructions for performing the steps of, tracking a first maximum number of characters which match the current position and a previous position which has a relatively larger value than the value of the current position, tracking a second maximum number of characters which match the current position and a previous position which has a relatively smaller value than the value of the current position, selecting the minimum value of the first and second maximum values, and comparing the characters beginning at the current position plus the minimum value with the characters beginning at each previous position plus the minimum value to determining the match length at each previous position.

\* \* \* \* \*

UNITED STATES PATENT AND TRADEMARK OFFICE
CERTIFICATE OF CORRECTION

PATENT NO. : 5,978,795
DATED : November 2, 1999
INVENTOR(S) : Poutanen et al.

It is certified that error appears in the above-identified patent and that said Letters Patent is hereby corrected as shown below:

Column 6,
Line 42, "compact" should read -- compact_ --.

Column 7,
Line 29, "command_" should read -- command_, --

Column 8,
Line 2, "$2_{16}$" should read -- $2^{16}$ --
Line 59, ""co"tree" should read -- "co" tree --.

Column 9,
Line 1, "search _ptr" should read -- search_ptr --.
Line 66, "compression_" should read -- compression_... --.

Column 10,
Line 7, "described" should read -- described --.

Signed and Sealed this

Twenty-first Day of September, 2004

JON W. DUDAS
*Director of the United States Patent and Trademark Office*